United States Patent
Yasui et al.

(10) Patent No.: US 12,146,799 B2
(45) Date of Patent: Nov. 19, 2024

(54) TEMPERATURE SENSOR FILM, CONDUCTIVE FILM AND METHOD FOR PRODUCING SAME

(71) Applicant: NITTO DENKO CORPORATION, Ibaraki (JP)

(72) Inventors: Satoshi Yasui, Ibaraki (JP); Kodai Miyamoto, Ibaraki (JP); Katsunori Shibuya, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 114 days.

(21) Appl. No.: 17/764,594

(22) PCT Filed: Sep. 16, 2020

(86) PCT No.: PCT/JP2020/035026
§ 371 (c)(1),
(2) Date: Mar. 29, 2022

(87) PCT Pub. No.: WO2021/065503
PCT Pub. Date: Apr. 8, 2021

(65) Prior Publication Data
US 2022/0349760 A1    Nov. 3, 2022

(30) Foreign Application Priority Data
Oct. 1, 2019    (JP) .................. 2019-181490

(51) Int. Cl.
*G01K 7/18*    (2006.01)
*G01K 7/16*    (2006.01)

(52) U.S. Cl.
CPC ....... *G01K 7/183* (2013.01); *G01K 2007/163* (2013.01)

(58) Field of Classification Search
CPC .................. G01K 7/183; G01K 2007/163
See application file for complete search history.

(56) References Cited

U.S. PATENT DOCUMENTS

| | | |
|---|---|---|
| 3,660,158 A | 5/1972 | Chen et al. |
| 2020/0271528 A1 | 8/2020 | Wienand et al. |

FOREIGN PATENT DOCUMENTS

| | | |
|---|---|---|
| CN | 101290240 A | 10/2008 |
| CN | 102831998 A | 12/2012 |

(Continued)

OTHER PUBLICATIONS

CN-110227464, machine translation. (Year: 2019).*
(Continued)

*Primary Examiner* — Kyung S Lee
(74) *Attorney, Agent, or Firm* — WHDA, LLP (57) ABSTRACT

Provided is a temperature sensor film comprising a metal-thin film patterned on a resin film substrate, and having high temperature measurement accuracy. A conductive film (102) that is used for producing a temperature sensor film has a nickel thin film (10) on one principal surface of a resin film substrate (50). It is preferable that the interplanar spacing of nickel (111) plane in the nickel thin-film is less than 0.2040 nm. The temperature sensor film is obtained by patterning the nickel thin film to form a temperature-measuring resistance part and a lead part connected to the temperature-measuring resistance part.

8 Claims, 2 Drawing Sheets

(56) References Cited

FOREIGN PATENT DOCUMENTS

| | | | | |
|---|---|---|---|---|
| CN | 105241568 | A | 1/2016 | |
| CN | 109668942 | A | 4/2019 | |
| CN | 109790624 | A | 5/2019 | |
| CN | 110227464 | * | 9/2019 | ............ B01J 23/755 |
| CN | 110227464 | A | 9/2019 | |
| JP | H03-212903 | A | 9/1991 | |
| JP | H07-333073 | A | 12/1995 | |
| JP | H11-354302 | A | 12/1999 | |
| JP | 2005-91045 | A | 4/2005 | |
| JP | 2020-126034 | A | 8/2020 | |
| TW | 201825711 | A | 7/2018 | |

OTHER PUBLICATIONS

Extended (Supplementary) European Search Report dated Sep. 1, 2023, issued in counterpart EP Application No. 20870613.5. (9 pages).
International Search Report dated Dec. 1, 2020, issued in counterpart Application No. PCT/JP2020/035026. (3 pages).
Notification of Transmittal of Translation of the International Preliminary Report on Patentability (Form PCT/IB/338) issued in counterpart International application No. PCT/JP2020/035026 mailed Apr. 14, 2022 with Forms PCT/IB/373 and PCT/ISA/237. (8 pages).
Office Action dated Aug. 15, 2023, issued in counterpart JP Application No. 2019-181490, with English translation. (10 pages).
Office Action dated Jul. 9, 2024, issued in counterpart TW Application No. 109133330, with English translation. (12 pages).

* cited by examiner

TEMPERATURE SENSOR FILM, CONDUCTIVE FILM AND METHOD FOR PRODUCING SAME

TECHNICAL FIELD

The present invention relates to a temperature sensor film including a patterned metal thin-film formed on a resin film base, an electroconductive film used in production of the temperature sensor film, and a method for producing the same.

BACKGROUND ART

A large number of temperature sensors are used in electronic devices. As the temperature sensor, a thermocouple or a chip thermistor is generally used. In a case where temperatures at a plurality of locations in one plane are measured by a thermocouple, a chip thermistor, or the like, it is required to arrange the temperature sensor at each measurement point and connect the respective temperature sensors to a printed wiring board or the like, resulting in a complicated production process. In addition, in order to measure an in-plane temperature distribution, it is required to arrange a large number of sensors on a substrate, which causes an increase in cost.

Patent Document 1 proposes a temperature sensor film in which a metal film is disposed on a film base, and the metal film is patterned to form a thermometric resistor part and a lead part. In the form of patterning the metal film, the thermometric resistor part and the lead part connected to the thermometric resistor part can be formed from one layer of the metal film, and it is not required to connect individual thermometric sensors by wiring. In addition, since the film base is used, there are advantages in that the temperature sensor film is excellent in flexibility and is easy to cope with an increase in area.

In the temperature sensor in which the metal film is patterned, the temperature is measured by applying a voltage to the thermometric resistor part through the lead part and using a characteristic that a resistance value of the metal varies depending on the temperature. In order to increase temperature measurement accuracy, a material having a large change in resistance with respect to a change in temperature is preferable. Patent Document 2 discloses that nickel is about twice as sensitive to the temperature (change in resistance) as copper.

PRIOR ART DOCUMENTS

Patent Documents

Patent Document 1: JP 2005-91045 A
Patent Document 2: JP H7-333073 A

SUMMARY OF THE INVENTION

Problems to be Solved by the Invention

It is known that a metal such as nickel exhibits a characteristic (positive characteristic) in which the resistance is increased as the temperature is higher, and bulk nickel has a change rate of resistance (temperature coefficient of resistance; TCR) with respect to the increase in temperature is about 6,000 ppm/° C. On the other hand, the metal thin-film often has different characteristics from those of a bulk metal due to the influence of the surface or the interface.

As a result of forming a nickel thin-film on a resin film base by a sputtering method and evaluating characteristics thereof, the present inventors have found that a temperature coefficient of resistance (TCR) is about half that of bulk nickel, and sufficient temperature measurement accuracy for use as a temperature sensor film cannot be obtained.

In view of the above problems, an object of the present invention is to provide an electroconductive film including a metal thin-film formed on a resin film base and having a large temperature coefficient of resistance, and a temperature sensor film.

Means for Solving the Problems

The present inventors have found that there is a high correlation between an interplanar spacing of the (111) plane and a TCR in a nickel thin-film, thereby completing the present invention.

An electroconductive film for a temperature sensor includes a nickel thin-film formed on one principal surface of a resin film base. It is preferable an interplanar spacing of the nickel (111) plane in the nickel thin-film disposed on the resin film is less than 0.2040 nm.

A temperature sensor film can be produced by patterning the nickel thin-film of the electroconductive film. The temperature sensor film includes the patterned nickel thin-film formed on one principal surface of the resin film base, and the nickel thin-film is patterned into a thermometric resistor part and a lead part. The nickel thin-film may be disposed on both surfaces of the resin film base.

The thermometric resistor part is provided in a portion where temperature measurement is performed, and is patterned into a thin wire. The lead part is patterned to have a larger wiring width than that of the thermometric resistor part, and one end of the lead part is connected to the thermometric resistor part. The other end of the lead part is connected to an external circuit or the like. A connector may be connected to the lead part, and the connection to the external circuit may be performed through the connector.

A temperature coefficient of resistance of the nickel thin-film is preferably 4,000 ppm/° C. or more. A thickness of the nickel thin-film is preferably 100 to 500 nm. An underlying layer may be disposed between the resin film base and the nickel thin-film. As a material of the underlying layer, an inorganic material such as a silicon-based thin-film is preferable.

Effects of the Invention

Since the interplanar spacing of the (111) plane in the nickel thin-film (lattice spacing of nickel) disposed on the resin film base is small, a temperature sensor film having a large temperature coefficient of resistance and high temperature measurement accuracy can be formed.

MODE FOR CARRYING OUT THE INVENTION

Figure 1:
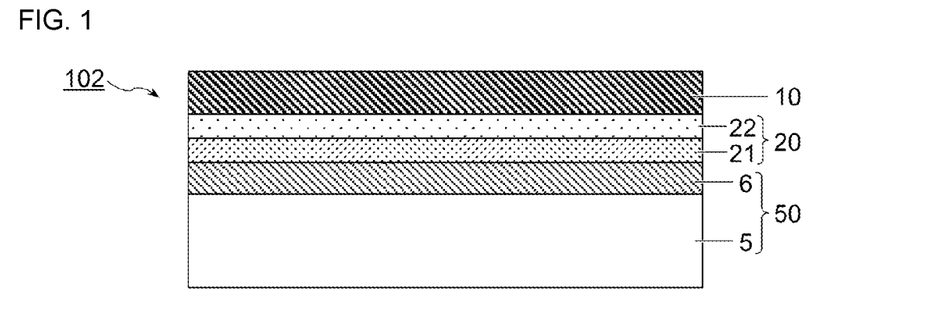
FIG. 1 is a cross-sectional view illustrating an example of a stacking configuration of an electroconductive film.
Figure 3:
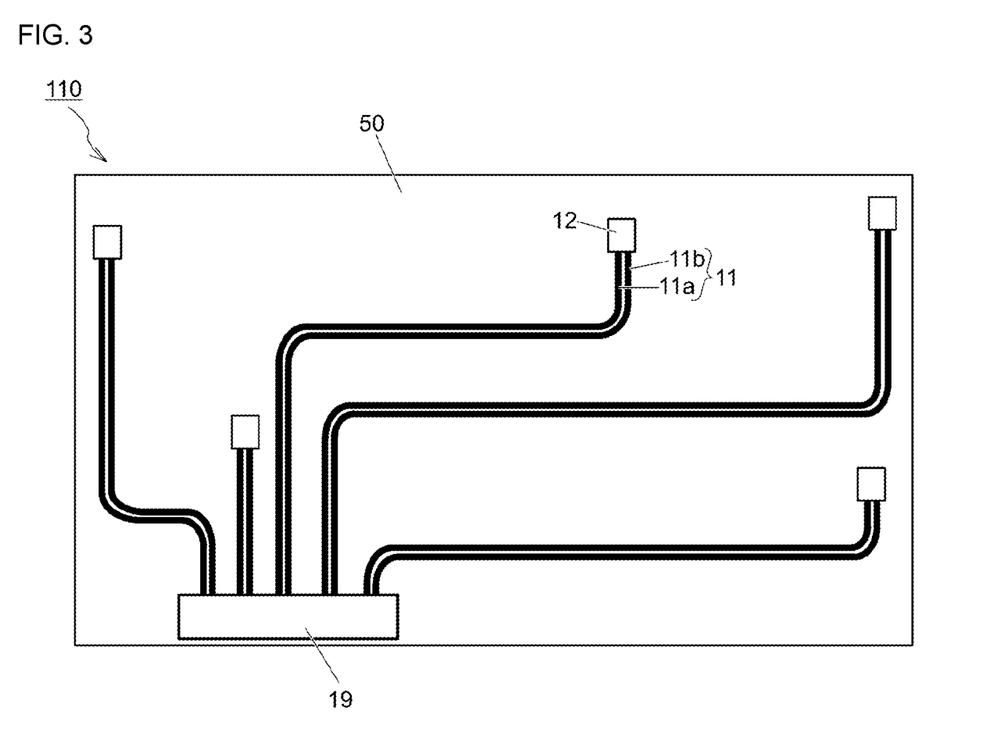
FIG. 3 is a plan view of a temperature sensor film.

FIG. 1 is a cross-sectional view illustrating example of a stacking configuration of an electroconductive film used for forming a temperature sensor film, in which a nickel thin-film 10 is disposed on one principal surface of a resin film base 50. A temperature sensor film 110 illustrated in a plan view of FIG. 3 is obtained by patterning the nickel thin-film of the electroconductive film 102.

[Electroconductive Film]

The electroconductive film has a nickel thin-film 10 on one principal surface of a resin film base 50. As illustrated in FIG. 1, the electroconductive film may include an underlying layer 20 between the resin film base 50 and the nickel thin-film 10.

<Resin Film Base>

The resin film base 50 may be transparent or non-transparent. The resin film base 50 may be made of only a resin film, or may include a hard coat layer (cured resin layer) 6 formed on a surface of a resin film 5 as illustrated in FIG. 1. A thickness of the resin film base is, although not particularly limited, generally about 2 to 500 μm, and preferably about 20 to 300 μm.

An easily adhesive layer, an antistatic layer, and the like may be disposed on a surface of the resin film base 50 (in a case where the hard coat layer 6 is disposed, the surface of the resin film 5 and/or the surface of the hard coat layer 6). The surface of the resin film base 50 may be subjected to a treatment such as a corona discharge treatment, an ultraviolet irradiation treatment, a plasma treatment, or a sputter etching treatment in order to increase adhesion to the underlying layer 20.

An arithmetic mean roughness Ra of the surface of the resin film base 50 on which the nickel thin-film 10 is formed is preferably 5 nm or less, more preferably 3 nm or less, and still more preferably 2 nm or less. By reducing a surface roughness of the base material, a coverage of the thin-film is improved, and a dense film is formed, such that a specific resistance of the nickel thin-film 10 tends to be decreased. The arithmetic mean roughness Ra is determined from an observation image of a 1 μm square using a scanning probe microscope.

(Resin Film)

Examples of a resin material of the resin film 5 include polyester such as polyethylene terephthalate, polyimide, polyolefin, cyclic polyolefin such as norbornene, polycarbonate, polyether sulfone, and polyarylate. Polyimide or polyester is preferable from the viewpoint of heat resistance, dimensional stability, electrical properties, mechanical properties, chemical resistance, and the like. A thickness of the resin film 5 is, although not particularly limited, generally about 2 to 500 μm, and preferably about 20 to 300 μm.

(Hard Coat Layer)

When a hard coat layer 6 is disposed on the surface of the resin film 5, hardness of the electroconductive film is improved so that scratch resistance is improved. The hard coat layer 6 can be formed, for example, by applying a solution containing a curable resin onto the resin film 5.

Examples of the curable resin include a thermosetting resin, an ultraviolet curable resin, and an electron beam curable resin. Examples of the type of curable resin include various resins such as polyester-based, acrylic, urethane-based, acrylic urethane-based, amide-based, silicone-based, silicate-based, epoxy-based, melamine-based, oxetane-based, and acrylic urethane-based resins.

Among them, an acrylic resin, an acrylic urethane-based resin, and an epoxy-based resin are preferable because these resins have high hardness, can be cured by ultraviolet rays, and have excellent productivity. In particular, an acrylic resin and an acrylic urethane-based resin are preferable because these resins have high adhesion to the chromium oxide thin-film included in the underlying layer. The ultraviolet curable resin encompasses ultraviolet curable monomer, oligomer, polymer, etc. Examples of the ultraviolet curable resin preferably used include resins having an ultraviolet polymerizable functional group, and among them, a resin containing, as a component, an acrylic monomer or oligomer having 2 or more, in particular, 3 to 6 ultraviolet polymerizable functional groups can be exemplified.

Fine particles may be contained in the hard coat layer 6. The fine particles are contained in the hard coat layer 6, such that a surface shape of a surface of the resin film base 50 on which the nickel thin-film 10 is formed (a surface on which the underlying layer 20 is formed) can be adjusted. As the fine particles, various metal oxide fine particles such as silica, alumina, titania, zirconia, calcium oxide, tin oxide, indium oxide, cadmium oxide, and antimony oxide, glass fine particles, crosslinked or uncrosslinked organic fine particles formed of polymers such as polymethyl methacrylate, polystyrene, polyurethane, an acrylic-styrene copolymer, benzoguanamine, melamine, and polycarbonate, silicone-based fine particles, and the like can be used without particular limitation.

An average particle diameter (average primary particle diameter) of the fine particles is preferably about 10 nm to 10 μm. When the hard coat layer contains fine particles having an average particle diameter in the order of submicron or micrometer, such as about 0.5 μm to 10 μm, preferably about 0.8 μm to 5 μm, protrusions having a diameter in the order of submicron or micrometer are formed on the surface of the hard coat layer 6 (the surface of the resin film base 50) and the surface of thin-film disposed on the hard coat layer 6, so that slipperiness, blocking resistance, and scratch resistance of the electroconductive film tend to be improved.

When the hard coat layer contains fine particles having an average particle diameter of about 10 nm to 100 nm, preferably about 20 to 80 nm, fine irregularities are formed on the surface of the hard coat layer 6 (the surface of the resin film base 50), and adhesion between the hard coat layer 6, the underlying layer 20, and the metal thin-film 10 tends to be improved.

A solution for forming a hard coat layer (hard coat composition) preferably contains an ultraviolet polymerization initiator. Additives such as a leveling agent, a thixotropic agent, and an antistatic agent may be contained in the solution.

A thickness of the hard coat layer 6 is, although not particularly limited, preferably 0.5 μm or more, more preferably 0.8 μm or more, and still more preferably 1 μm or more, in order to realize high hardness. In consideration of ease of formation by application, the thickness of the hard coat layer is preferably 15 μm or less and more preferably 10 μm or less.

<Underlying Layer>

As illustrated in FIG. 1, the underlying layer 20 may be disposed between the resin film base 50 and the nickel thin-film 10. The underlying layer 20 may be a single layer, and may have a stacking configuration of two or more thin-films 21 and 22 as illustrated in FIG. 1. By disposing the underlying layer 20 on the resin film base 50 and forming the nickel thin-film 10 on the underlying layer 20, plasma damage to the resin film base 50 during the deposition of the nickel thin-film 10 can be suppressed. In addition, by disposing the underlying layer 20, moisture, an organic gas, or the like generated from the resin film base 50 can be blocked, and mixing of impurities into the nickel thin-film 10 can be suppressed. The underlying layer 20 is preferably an inorganic material, from the viewpoint of suppressing mixing of organic matters into the nickel thin-film.

The underlying layer 20 may be electroconductive or insulative. In a case where the underlying layer 20 is an electroconductive inorganic material (inorganic conductor), the underlying layer 20 may be patterned together with the nickel thin-film 10 at the time of producing a temperature sensor film. In a case where the underlying layer 20 is an insulating inorganic material (inorganic dielectric), the underlying layer 20 may be patterned or may not be patterned.

Examples of the inorganic material include metal elements or semimetal elements such as Si, Ge, Sn, Pb, Al, Ga, In, Tl, As, Sb, Bi, Se, Te, Mg, Ca, Sr, Ba, Sc, Y, Ti, Zr, Hf, V, Nb, Ta, Cr, Mo, W, Mn, Tc, Re, Fe, Ru, Os, Co, Rh, Ir, Pd, Pt, Cu, Ag, Au, Zn, and Cd, and alloys, nitrides, oxides, and nitrogen oxides thereof. A material of the underlying layer is preferably a silicon-based material, a chromium-based material, or the like, because it is excellent in adhesion to both the resin film base and the nickel thin-film, has a high effect of suppressing mixing of impurities into the nickel thin-film 10 from the resin film base 50, and can promote a crystal growth in the nickel thin-film. Silicon oxide is particularly preferable as the silicon-based material, and chromium oxide is particularly preferable as the chromium-based material.

By disposing the thin-film 22 having a high specific resistance such as silicon oxide thin-film under the nickel thin-film 10, a leakage current between wirings (patterned nickel thin-film) tends to be reduced, and the temperature measurement accuracy of the temperature sensor film tends to be improved. Silicon oxide may be a stoichiometric composition ($SiO_2$) or may be a non-stoichiometric composition ($SiO_x$, $x<2$). In a non-stoichiometric silicon oxide ($SiO_x$), it is preferable $1.2 \leq x < 2$ is satisfied.

As the underlying layer 20, the silicon oxide thin-film 22 may be formed on the silicon thin-film 21. In addition, the silicon oxide thin-film 22 may be formed on the inorganic thin-film 21 formed of various metals, electroconductive oxide, ceramic, or the like.

By forming the nickel thin-film 10 on the inorganic underlying layer 20, the interplanar spacing of the nickel (111) plane tends to be reduced, and the TCR tends to be increased. In particular, in a case where the underlying layer 20 is a silicon-based thin-film, the TCR of the nickel thin-film tends to be increased, and this tendency is remarkable in a case where a silicon oxide thin-film is disposed immediately under the nickel thin-film 10. In addition, in a case where the underlying layer 20 has a configuration in which a chromium-based thin-film 21 and a silicon oxide thin-film 22 are stacked, the TCR of the nickel thin-film tends to be increased, and this tendency is remarkable in a case where the thin-film 21 in contact with the resin film base is a chromium oxide thin-film. A chromium-based thin-film such as chromium oxide is likely to form a dense film having high smoothness, and the inorganic thin-film 22 formed on the dense film has also improved surface smoothness, which is considered to be one of the factors of improving the TCR of the nickel thin-film 10.

The thickness of the underlying layer is not particularly limited. The thickness of the underlying layer is preferably 1 nm or more, more preferably 3 nm or more, and still more preferably 5 nm or more, from the viewpoint of reducing plasma damage to the resin film base and enhancing the effect of blocking outgassing from the resin film base. The thickness of the underlying layer is preferably 200 nm or less, more preferably 100 nm or less, and still more preferably 50 nm or less, from the viewpoint of improving productivity and reducing material costs. In a case where the underlying layer is composed of a plurality of layers, the total thickness is preferably within the above range.

A method for forming the underlying layer 20 is not particularly limited, and either dry coating or wet coating can be adopted. In a case where the metal thin-film is formed by a sputtering method, it is preferable that the underlying layer 20 is also formed by the sputtering method from the viewpoint of productivity. In addition, the underlying layer 20 is preferably formed by a sputtering method because a dense film is easily formed, and the effect of suppressing mixing of moisture or organic matters of the nickel thin-film 10 from the resin film base 50 is excellent.

A target may be selected according to the material of the underlying layer, when the underlying layer is formed by a sputtering method. For example, when a silicon thin-film is formed, a silicon target is used. In deposition of the silicon oxide thin-film, a silicon oxide target may be used, or silicon oxide may be formed by reactive sputtering using a silicon target. In the reactive sputtering, it is preferable to adjust the amount of oxygen so as to form an intermediate transition region between the metal region and the oxide region <Nickel Thin-Film>

The nickel thin-film 10 disposed on the resin film base 50 plays a central role in the temperature measurement in the temperature sensor. By patterning the nickel thin-film 10, a lead part 11 and a thermometric resistor part 12 are formed as illustrated in FIG. 3.

The nickel thin-film 10 is preferably a thin-film consisting of nickel and inevitable impurities, and a proportion of nickel is preferably 99 wt % or more and preferably 99.9 wt % or more. For example, a thin-film consisting of nickel and inevitable impurities is formed by sputtering deposition using a nickel target.

The thickness of the nickel thin-film 10 is, although not particularly limited, preferably 20 nm or more, more preferably 40 nm or more, and still more preferably 50 nm or more, from the viewpoint of low resistance (in particular, from the viewpoint of reducing resistance of the lead part). On the other hand, from the viewpoint of shortening the deposition time, improving the patterning accuracy, and the like, the thickness of the nickel thin-film 10 is preferably 500 nm or less, more preferably 300 nm or less, and still more preferably 250 nm or less.

The temperature coefficient of resistance (TCR) of the nickel thin-film 10 is preferably 3,000 ppm/° C. or more, more preferably 3,500 ppm/° C. or more, and still more preferably 4,000 ppm/° C. or more. The TCR is a rate of change in resistance with respect to an increase in temperature. Nickel has a characteristic (positive characteristic) in which the resistance is linearly increased according to the increase in temperature. The TCR of the material having the positive characteristic is calculated from a resistance value $R_0$ at a temperature $T_0$ and a resistance value $R_1$ at a temperature $T_1$ by the following equation.

$$TCR = \{(R_1 - R_0)/R_0\}/(T_1 - T_0)$$

In the present specification, an average value of a TCR calculated from the resistance values at $T_0 = 25°$ C. and $T_1 = 5°$ C. and a TCR calculated from the resistance values at $T_0 = 25°$ C. and $T_1 = 45°$ C. is defined as the TCR of the nickel thin-film.

As the TCR is larger, the change in resistance with respect to the change in temperature is increased, and the temperature measurement accuracy in the temperature sensor film is improved. Therefore, the TCR of the nickel thin-film is preferably as large as possible, but it is difficult to make the TCR larger than that of bulk nickel, and the TCR of the nickel thin-film is generally 6,000 ppm/° C. or less.

Figure 2:
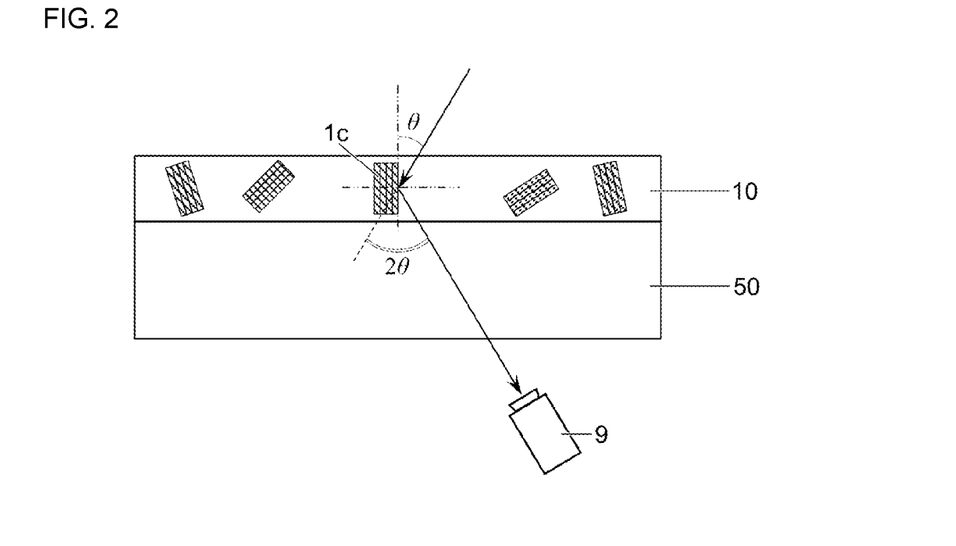
FIG. 2 shows an optical system of X-ray diffraction used for measuring interplanar spacing of nickel thin-film.

It is preferable that interplanar spacing of the nickel (111) plane determined by X-ray diffraction in the nickel thin-film 10 is less than 0.2040 nm. In the X-ray diffraction, as illustrated in FIG. 2, 2θ/θ scanning is performed by an optical system in which an incident optical system (X-ray source) and a light receiving optical system (detector 9) are arranged symmetrically with respect to a normal direction of the surface of the nickel thin-film, and a lattice interplanar spacing of a crystal 1c whose normal line of the lattice surface is parallel to the film surface is measured. In an X-ray diffraction chart using a CuKα ray (wavelength: 0.15418 nm) as an X-ray source, a peak of the (111) plane of nickel appears in the vicinity of 2θ=44.5°. From the angle 2θ at which this peak is maximized, the interplanar spacing of the (111) plane is calculated based on Bragg's law. An interplanar spacing of crystals generally does not depend on a measurement direction, but in a case where the crystals have anisotropy caused during deposition of the nickel thin-film or a subsequent process, the interplanar spacing may be anisotropic. For example, a conveyance tension in a roll-to-roll process and anisotropy such as a rate of dimensional change and a Young's modulus of the film base may be factors that cause the anisotropy in the interplanar spacing. In a case where there the crystal is anisotropic in the interplanar spacing, an average value $(d_1+d_2)/2$ of an interplanar spacing $d_1$ measured by making an X-ray incident from an arbitrary first direction and an interplanar spacing $d_2$ measured by making an X-ray incident from a second direction perpendicular to the first direction is defined as the interplanar spacing of the crystal in the nickel thin-film.

The TCR of the nickel thin-film tends to be increased as the interplanar spacing of the (111) plane is reduced. The interplanar spacing of the nickel (111) plane may be 0.2039 nm or less, 0.2038 nm or less, or 0.2037 nm or less. The interplanar spacing of the nickel (111) plane of nickel is generally 0.2030 nm or more. A single crystal of nickel is a cubic crystal having a lattice constant of 0.3524 nm, and the interplanar spacing of the (111) plane is 0.2035 nm. The nickel thin-film formed on the resin film base has a lattice constant larger than that of the single crystal, and the interplanar spacing of the (111) plane tends to be large. In particular, when the interplanar spacing is 0.2040 nm or more, it can be said that a strain of the crystal is large.

The resistance value of the material is affected by an electron density and electron mobility in the material, and the resistance is increased as the electron density is decreased and the electron mobility is decreased. Since a metal such as nickel is rich in free electrons, the electron mobility becomes a factor that controls the resistance. Scattering mechanisms include scattering due to collision with atomic nuclei (lattice vibration scattering), scattering due to impurities or lattice defects (impurity scattering), and magnetic scattering. Among them, it is known that the lattice vibration scattering and the magnetic scattering have large temperature dependence, and the impurity scattering has small temperature dependence.

When the interplanar spacing of the (111) plane is less than 0.2040 nm and is close to the interplanar spacing of the (111) plane of Ni single crystal, which is 0.2035 nm, this means disturbance of the crystal (lattice defect) is small.

That is, it is considered that in a case where the interplanar spacing of the (111) plane in the nickel thin-film is small, the influence of the impurity scattering is small, and the influence of the lattice vibration scattering and the magnetic scattering is relatively large, such that the temperature dependence of resistance (TCR) is increased.

As described above, by disposing the underlying layer 20 on the resin film base 50 and forming the nickel thin-film on the underlying layer 20, the interplanar spacing of the nickel (111) plane tends to be reduced, and the TCR tends to be increased. By disposing the underlying layer 20, the underlying layer acts as a buffer layer that alleviates a mismatch of lattice spacing of nickel, and has an action of promoting crystallization of nickel to reduce the lattice defects, which is considered to contribute to reducing the lattice spacing.

As a thickness of the nickel thin-film is larger, the interplanar spacing of the (111) plane tends to be reduced, and the TCR tends to be increased. In order to obtain an electroconductive film having a TCR of 4,000 ppm/° C. or more, the thickness of the nickel thin-film is preferably 80 nm or more, more preferably 100 nm or more, and still more preferably 120 nm or more.

<Method for Forming Nickel Thin Film>

A method for forming the nickel thin-film is not particularly limited, and for example, a film forming method such as a sputtering method, a vacuum deposition method, an electron beam deposition method, a chemical vapor deposition method (CVD), a chemical solution deposition method (CBD), or a plating method can be adopted. Among them, a sputtering method is preferable because a thin-film having excellent film thickness uniformity can be formed. By performing deposition while continuously moving the long resin film base in a longitudinal direction using a roll-to-roll sputtering apparatus, productivity of the electroconductive film is increased.

It is preferable that a roll-shaped resin film base is loaded in the sputtering apparatus, and then, the inside of the sputtering apparatus is exhausted before the start of the sputtering deposition to obtain an atmosphere in which an impurity of moisture or an organic gas generated from the resin film base is removed. By removing gas in the apparatus and the resin film base in advance, a concentration of the impurities in the nickel thin-film tends to be reduced, and the interplanar spacing of the (111) plane tends to be reduced. A degree of vacuum (degree of ultimate vacuum) in the sputtering apparatus before the start of the sputtering deposition is, for example, $1\times10^{-2}$ Pa or less, preferably $5\times10^{-3}$ Pa or less, more preferably $1\times10^{-3}$ Pa or less, still more preferably $5\times10^{-4}$ Pa or less, and particularly preferably $5\times10^{-5}$ Pa or less.

In the sputtering deposition of the nickel thin-film, a metal Ni target is used, and the deposition is performed while an inert gas such as argon is introduced. Although the deposition conditions of the nickel thin-film are not particularly limited, it is preferable to select deposition conditions so as to reduce mixing of impurities caused by moisture or an organic gas from the resin film base. Examples of a method for reducing the amount of impurities in the nickel thin-film include: (1) as described above, subjecting the resin film base under vacuum before the sputtering deposition to remove moisture or an organic gas in the resin film base; (2) reducing damage to the resin film base during the sputtering deposition; and (3) disposing an underlying layer such as a silicon oxide thin-film on the resin film base to block moisture or an organic gas from the resin film base.

Examples of the method for reducing damage to the resin film base during the sputtering deposition include lowering a substrate temperature during deposition and lowering a discharge power density. For example, in a case where the nickel thin-film is directly formed on the resin film base, from the viewpoint of suppressing generation of moisture or an organic gas from the resin film base, the substrate temperature is preferably 80° C. or lower, more preferably 60° C. or lower, and still more preferably 50° C. or lower.

In a case where the underlying layer is disposed on the resin film base and the nickel thin-film is formed on the underlying layer, the underlying layer has an action of blocking moisture or an organic gas from the resin film base even when the substrate temperature is high. Therefore, the substrate temperature during deposition of the nickel thin-film can be appropriately set in a range in which the resin film base has heat resistance. In addition, the interplanar spacing of the (111) plane tends to be reduced as the substrate temperature is higher. Therefore, in a case where the underlying layer is disposed on the resin film base and the nickel thin-film is formed on the underlying layer, the substrate temperature is preferably 30° C. or higher, more preferably 50° C. or higher, and still more preferably 70° C. or higher. The substrate temperature may be 100° C. or higher, 120° C. or higher, or 130° C. or higher.

From the viewpoint of suppressing damage to the resin film base while stabilizing plasma discharge, the discharge power density is preferably 0.1 to 5.0 W/cm$^2$ and more preferably 1.0 to 3.5 W/cm$^2$.

<Heat Treatment>

A heat treatment may be performed after deposition of the thin-film. By heating the electroconductive film including the nickel thin-film formed on the resin film base, crystallization of nickel tends to be increased and the interplanar spacing of the (111) plane tends to be reduced, leading to increase of the TCR. When the crystallization of nickel by heating proceeds, a reduction in lattice defects due to rearrangement of atoms and the like are considered to contribute to reducing the lattice spacing.

In a case where a heat treatment is performed, a heating temperature is preferably 80° C. or higher, more preferably 100° C. or higher, and still more preferably 120° C. or higher. An upper limit of the heating temperature may be determined in consideration of heat resistance of the resin film base, and is generally 200° C. or lower or 180° C. or lower. In a case where a highly heat-resistant film base such as a polyimide film is used, the heating temperature may be higher than the above range. A heating time is preferably 1 minute or longer, more preferably 5 minutes or longer, and still more preferably 10 minutes or longer. The timing of performing the heat treatment is not particularly limited as long as it is performed after the nickel thin-film is formed. For example, the heat treatment may be performed after patterning the nickel thin-film.

[Temperature Sensor Film]

A temperature sensor film is formed by patterning the nickel thin-film 10 of the electroconductive film. As illustrated in FIG. 3, in the temperature sensor film, the nickel thin-film includes a lead part 11 formed in a wiring shape and a thermometric resistor part 12 connected to one end of the lead part 11. The other end of the lead part 11 is connected to a connector 19.

Figures 4A, 4B:
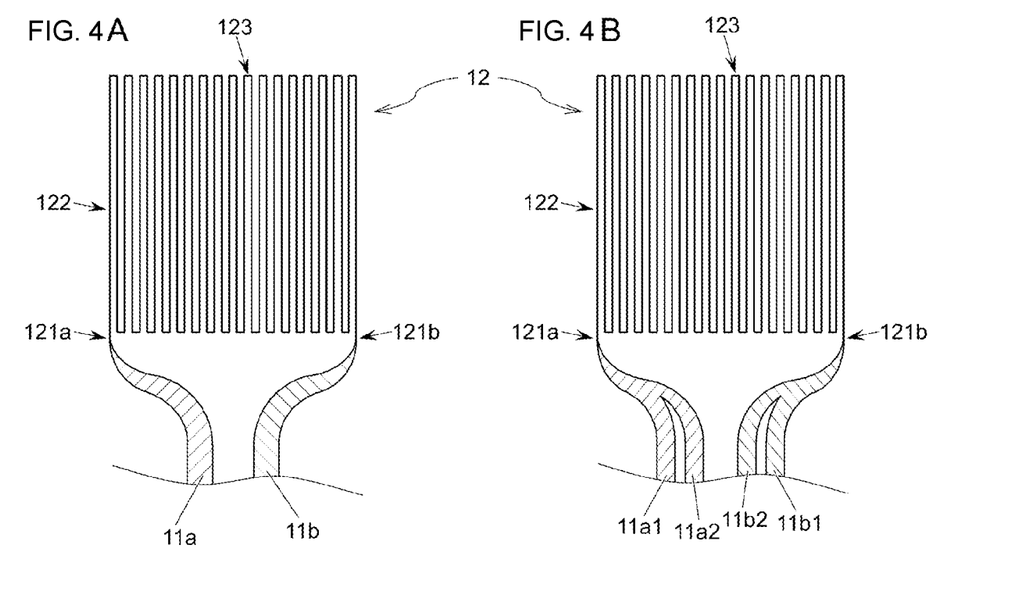
FIGS. 4A and 4B are each enlarged view of the vicinity of a thermometric resistor part in a temperature sensor, wherein FIG. 4A indicates a two-wire type and FIG. 4B indicates a four-wire type.

The thermometric resistor part 12 is a region that acts as a temperature sensor, and the temperature measurement is performed by applying a voltage to the thermometric resistor part 12 through the lead part 11 and calculating the temperature from a resistance value thereof. By providing a plurality of thermometric resistor parts in a plane of a temperature sensor film 110, the temperatures at a plurality of locations can be simultaneously measured. For example, in the form illustrated in FIG. 4, the thermometric resistor parts 12 are provided at five locations in the plane.

FIG. 4A is an enlarged view of the vicinity of the thermometric resistor part in a two-wire temperature sensor. The thermometric resistor part 12 is formed by sensor wirings 122 and 123 in which a nickel thin-film is patterned into a thin wire shape. In the sensor wiring, a plurality of vertical electrodes 122 are connected at the end thereof through the horizontal wiring 123 to form a hairpin-shaped bent part, thereby having a zigzag pattern.

As the wiring width of the thin wire constituting the pattern shape of the thermometric resistor part 12 is smaller (the cross-sectional area is smaller) and the line length from one end 121a to the other end 121b of the sensor wiring of the thermometric resistor part 12 is larger, the resistance between two points is larger, and a resistance change amount is also larger according to the change in temperature. Therefore, the temperature measurement accuracy is improved. By forming the zigzag wiring pattern as illustrated in FIG. 4, the area of the thermometric resistor part 12 can be decreased, and the length of the sensor wiring (line length from one end 121a to the other end 121b) can be increased. The pattern shape of the sensor wiring of the thermometric resistor part is not limited to the form as illustrated in FIG. 4, and may be a pattern shape such as a spiral shape.

The wiring width of the sensor wiring 122 (vertical wiring) and the distance (space width) between adjacent wirings may be set according to the patterning accuracy of photolithography. The wiring width and the space width are generally about 1 to 150 μm. The wiring width is preferably 3 μm or more and preferably 5 μm or more from the viewpoint of preventing disconnection of the sensor wiring. The wiring width is preferably 100 μm or less and more preferably 70 μm or less from the viewpoint of increasing the change in resistance and increasing the temperature measurement accuracy. The space width is preferably 3 to 100 μm and more preferably 5 to 70 μm from the same viewpoints.

Both the ends 121a and 121b of the sensor wiring of the thermometric resistor part 12 are connected to ends of the lead parts 11a and 11b, respectively. Two lead parts 11a and 11b are formed in an elongated pattern in a state of facing each other with a slight gap, and the other end of the lead part is connected to the connector 19. The lead part is formed wider than the sensor wiring of the thermometric resistor part 12 in order to secure a sufficient current capacity. Widths of the lead parts 11a and 11b are, for example, about 0.5 to 10 mm. The wiring width of the lead part is preferably 3 times or more, more preferably 5 times or more, and still more preferably 10 times or more the wiring width of the sensor wiring 122 of the thermometric resistor part 12.

The connector 19 has a plurality of terminals, and a plurality of lead parts are connected to different terminals, respectively. The connector 19 is connected to an external circuit, and a voltage is applied between the lead part 11a and the lead part 11b, such that a current flows through the lead part 11a, the thermometric resistor part 12, and the lead part 11b. A resistance value is calculated from a current value when a predetermined voltage is applied, or from an applied voltage when a voltage is applied so that the current becomes a predetermined value. The temperature is calculated from the resistance value based on a relational expression between the obtained resistance value and a temperature obtained in advance, a table in which a relationship between the resistance value and the temperature is recorded, and the like.

The resistance value obtained here includes the resistances of the lead part 11a and the lead part 11b in addition to the resistance of the thermometric resistor part 12. However, since the resistance of the thermometric resistor part 12 is sufficiently larger than the resistances of the lead parts 11a and 11b, the obtained measurement value can be regarded as the resistance of the thermometric resistor part 12. The lead part may be a four-wire type from the viewpoint of reducing the influence by the resistance of the lead part.

FIG. 4B is an enlarged view of the vicinity of the thermometric resistor part in a four-wire temperature sensor. The pattern shape of the thermometric resistor part 12 is identical to that in FIG. 4A. In the four-wire type, four lead parts 11a1, 11a2, 11b1, and 11b2 are connected to one thermometric resistor part 12. The lead parts 11a1 and 11b1 are voltage measurement leads, and the lead parts 11a2 and 11b2 are current measurement leads. The voltage measurement lead 11a1 and the current measurement lead 11a2 are connected to the end 121a of the sensor wiring of the thermometric resistor part 12, and the voltage measurement lead 11b1 and the current measurement lead 11b2 are connected to the other end 121b of the sensor wiring of the thermometric resistor part 12. In the four-wire type, the resistance value of only the thermometric resistor part 12 can be measured by excluding the resistance of the lead part, and thus, measurement with less error can be performed. In addition to the two-wire type and the four-wire type, a three-wire type may be adopted.

A method for pattering the nickel thin-film is not particularly limited. Since the patterning is easy and accuracy is high, it is preferable to perform patterning by a photolithography method. In the photolithography, an etching resist corresponding to the shapes of the lead part and the thermometric resistor part are formed on the surface of the nickel thin-film, the nickel thin-film in a region in which the etching resist is not formed is removed by wet etching, and then, the etching resist is peeled off. The patterning of the nickel thin-film can also be performed by dry etching such as laser processing.

In the above embodiment, the nickel thin-film 10 is formed on the resin film base 50 by a sputtering method or the like, and the nickel thin-film is patterned, such that a plurality of each of lead parts and thermometric resistor parts can be formed in the plane of the substrate. A temperature sensor element is obtained by connecting the connector 19 to the end of the lead part 11 of the temperature sensor film. In this embodiment, the lead parts are connected to the plurality of thermometric resistor parts, and the plurality of lead parts may be connected to one connector 19. Therefore, it is possible to easily form a temperature sensor element capable of measuring temperatures at a plurality of locations in the plane.

In the above embodiment, the nickel thin-film are disposed on one principal surface of the resin film base. In contrast, the nickel thin-film may be disposed on both surface of the resin film base. In addition, the nickel thin-film may be disposed on one principal surface of the resin film base, and a thin-film made of other material may be disposed on the other principal surface.

A method for connecting the lead part of the temperature sensor film and the external circuit is not limited to the connection through the connector. For example, a controller for applying a voltage to the lead part and measuring the resistance may be provided on the temperature sensor film. In addition, the lead part and the lead wiring from the external circuit may be connected by soldering or the like without through the connector.

The temperature sensor film has a simple configuration in which a thin-film is disposed on a resin film base, and thus has excellent productivity, is easy to be processed, and can be applied to a curved surface. In addition, since the lattice spacing of Ni crystal in the nickel thin-film is small and TCR is large, more accurate temperature measurement can be realized.

EXAMPLES

Hereinafter, the present invention will be described in more detail with reference to Examples, but the present invention is not limited to the following Examples.

Example 1

A roll of a polyethylene terephthalate (PET) film ("LU-MIRROR™ 149UNS" manufactured by TORAY Industries, arithmetic mean roughness Ra: 1.6 nm) having a thickness of 150 μm was set in a roll-to-roll sputtering apparatus, exhaustion was performed until a degree of ultimate vacuum in the sputtering apparatus reached $5.0 \times 10^{-3}$ Pa, and then, a silicon thin-film having a thickness of 5 nm, a silicon oxide thin-film having a thickness of 10 nm, and a nickel thin-film having a thickness of 270 nm were sequentially deposited on the PET film at a substrate temperature of 150° C. by DC sputtering. A B-doped Si target was used to form a Si layer and a $SiO_2$ layer. The Si layer was deposited by introducing argon as a sputtering gas under conditions of a pressure of 0.3 Pa and a power density of 1.0 W/cm². The $SiO_2$ layer was deposited by introducing oxygen as a reactive gas ($O_2$/Ar=0.12/1.0) in addition to argon as a sputtering gas under conditions of a pressure of 0.3 Pa and a power density of 1.8 W/cm². In formation of the nickel thin-film, a metal nickel target was used, and the deposition was performed under conditions of a pressure of 0.25 Pa and a power density of 5.6 W/cm².

Example 2

The electroconductive film of Example 1 was heated in a hot air oven at 155° C. for 60 minutes to produce an electroconductive film.

Comparative Example 1

A nickel thin-film having a thickness of 230 nm was deposited on a PET film, and an electroconductive film including the nickel thin-film in contact with the PET film was produced under the same conditions as those of Example 1 without forming a silicon thin-film and a silicon oxide thin-film.

Comparative Example 2

An electroconductive film was produced in the same manner as that of Comparative Example 1, except that the thickness of the nickel thin-film was changed to 180 nm.

Comparative Example 3

An electroconductive film was produced in the same manner as that of Comparative Example 1, except that the thickness of the nickel thin-film was changed to 160 nm.

Example 3

The electroconductive film of Comparative Example 3 was heated in a hot air oven at 155° C. for 60 minutes to produce an electroconductive film.

Example 4

An electroconductive film including a nickel thin-film formed on a PET film with a chromium thin-film and a silicon oxide thin-film as an underlying layer interposed therebetween was produced in the same manner as that of Example 3, except that a metal chromium thin-film having a thickness of 5 nm was formed instead of the silicon thin-film. In formation of the chromium thin-film, a metal chromium target was used, argon was introduced as a sputtering gas, and deposition was performed under conditions of a pressure of 0.25 Pa and a power density of 0.74 W/cm$^2$.

Example 5

The electroconductive film of Example 4 was heated in a hot air oven at 155° C. for 60 minutes to produce an electroconductive film.

Comparative Example 4

An electroconductive film including a nickel thin-film formed on a PET film with a chromium oxide thin-film and a silicon oxide thin-film as an underlying layer interposed therebetween was produced in the same manner as that of Example 3, except that a chromium oxide thin-film having a thickness of 5 nm was formed instead of the silicon thin-film. In formation of the chromium oxide thin-film, a metal chromium target was used, oxygen was introduced in addition to argon as a sputtering gas ($O_2$/Ar=0.12/1.0), and deposition was performed under conditions of a pressure of 0.19 Pa and a power density of 1.82 W/cm$^2$.

Example 6

The electroconductive film of Comparative Example 4 was heated in a hot air oven at 155° C. for 60 minutes to produce an electroconductive film.

Example 7

An electroconductive film including a nickel thin-film formed on a PET film with an aluminum doped zinc oxide (AZO) thin-film and a silicon oxide thin-film as an underlying layer interposed therebetween was produced in the same manner as that of Example 3, except that an AZO thin-film having a thickness of 5 nm was formed instead of the silicon thin-film. In formation of the AZO thin-film, a sintered target of indium tin oxide was used, oxygen was introduced in addition to argon as a sputtering gas ($O_2$/Ar=0.12/1.0), and deposition was performed under conditions of a pressure of 0.19 Pa and a power density of 1.82 W/cm$^2$. Thus obtained electroconductive film was heated in a hot air oven at 155° C. for 60 minutes.

[Evaluation]

<X-Ray Diffraction>

2θ/θ scanning was performed by setting a normal direction of the film surface to θ=0° by an optical system illustrated in FIG. 2 using a powder X-ray diffractometer ("SmartLab" "SMARTLAB" manufactured by RIGAKU Corporation) under the following conditions, and an interplanar spacing of the (111) plane in which the normal line of the lattice surface was directed to the film surface of the nickel thin-film was measured. An MD (a conveyance direction during sputtering deposition) was measured by setting an X-ray irradiation direction (a plane including an X-ray incident optical system and a light receiving optical system) to be parallel to the MD, and a TD (a direction perpendicular to the MD) was measured by rotating a sample stage by 90°. For each of the MD and TD, the interplanar spacing of the (111) plane was calculated from a peak angle of a diffraction peak ((111) plane diffraction peak of Ni(fcc)) in the vicinity of 2θ=44.5° of the obtained X-ray diffraction pattern.

X-ray source: CuKα ray (wavelength: 0.15418 nm), 45 kV, 200 mA

Optical system: parallel beam optical system

Incident slit: 1.0 mm

Incident PSA: 0.5°

Longitudinal limit slit: 10 mm

Light receiving PSA: 0.114°

Light receiving slit 1: 20 mm

Light receiving slit 2: 20.1 mm

Scan axis: 2θ/θ

Step width: 0.04°

Scan range: 40° to 46°

<Temperature Coefficient of Resistance (TCR)>

(Preparation of Temperature Sensor Film)

The electroconductive film was cut into a size of 10 mm×200 mm, the nickel layer was patterned into a stripe shape having a wiring width of 30 μm by laser patterning to form a thermometric resistor part having the shape illustrated in FIG. 4A. At the time of patterning, the length of the pattern was adjusted such that the total wiring resistance was about 10 kΩ and the resistance of the thermometric resistor part was 30 times the resistance of the lead part, thereby preparing a temperature sensor film.

(Measurement of Temperature Coefficient of Resistance)

In a small heating and cooling oven, the thermometric resistor part of the temperature sensor film was set to 5° C., 25° C., and 45° C. One tip and the other tip of the lead part were connected to a tester, a constant current was applied, and a voltage was read to measure a two-terminal resistance at each temperature. An average value of the TCR calculated from the resistance values at 5° C. and 25° C. and the TCR calculated from the resistance values at 25° C. and 45° C. was defined as a TCR of the nickel layer.

[Evaluation Results]

The stacking configuration of the electroconductive film and the heat treatment conditions after the deposition and the characteristics (the interplanar spacing of the Ni(111) plane and the TCR) of the electroconductive film of each of Examples and Comparative Examples are shown in Table 1.

TABLE 1

| | Configuration of Underlying layer | Ni layer thickness (nm) | Heat treatment | Ni (111) interplanar spacing (nm) | | | TCR (ppm/° C.) |
|---|---|---|---|---|---|---|---|
| | | | | MD | TD | Average | |
| Example 1 | Si (5 nm)/ SiO$_2$ (10 nm) | 270 | — | 0.20370 | 0.20377 | 0.20373 | 4284 |
| Example 2 | Si (5 nm)/ SiO$_2$ (10 nm) | 270 | 155° C. 60 min | 0.20338 | 0.20335 | 0.20336 | 4744 |
| Comparative Example 1 | — | 230 | — | 0.20407 | 0.20419 | 0.20413 | 3763 |
| Comparative Example 2 | — | 180 | — | 0.20388 | 0.20427 | 0.20407 | 3579 |
| Comparative Example 3 | Si (5 nm)/ SiO$_2$ (10 nm) | 160 | — | 0.20400 | 0.20418 | 0.20409 | 3926 |
| Example 3 | Si (5 nm)/ SiO$_2$ (10 nm) | 160 | 155° C. 60 min | 0.20353 | 0.20372 | 0.20363 | 4246 |
| Example 4 | CrO (5 nm)/ SiO$_2$ (10 nm) | 160 | — | 0.20373 | 0.20389 | 0.20381 | 4191 |
| Example 5 | CrO (5 nm)/ SiO$_2$ (10 nm) | 160 | 155° C. 60 min | 0.20341 | 0.20345 | 0.20343 | 4540 |
| Comparative Example 4 | Cr (5 nm)/ SiO$_2$ (10 nm) | 160 | — | 0.20409 | 0.20412 | 0.20411 | 3853 |
| Example 6 | Cr (5 nm)/ SiO$_2$ (10 nm) | 160 | 155° C. 60 min | 0.20356 | 0.20349 | 0.20352 | 4278 |
| Example 7 | AZO (5 nm)/ SiO$_2$ (10 nm) | 160 | 155° C. 60 min | 0.20350 | 0.20374 | 0.20362 | 4399 |

Focusing on a relationship between the interplanar spacing of the Ni(111) plane and the TCR, it can be seen that the TCR tends to be increased as the interplanar spacing is smaller, and when the interplanar spacing is less than 0.2040 nm, the TCR exceeds 4,000 ppm/° C.

The comparison between Comparative Examples 1 and 2, the comparison between Example 1 and Comparative Example 3, and the comparison between Examples 2 and 3 showed that as the thickness of the nickel thin-film was larger, the interplanar spacing of the Ni(111) plane tended to be reduced, and the TCR tended to be increased. On the other hand, the comparison between Comparative Examples 1 and 2, and Comparative Example 3, Example 4, and Comparative Example 4 showed that even in case where the thickness of the nickel thin-film was small, when the underlying layer was disposed between the resin film base and the nickel thin-film, the interplanar spacing of the Ni(111) plane tended to be reduced, and the TCR tended to be increased. In addition, when the heat treatment was performed after the deposition, the interplanar spacing of the Ni(111) plane tended to be reduced, and the TCR tended to be increased.

From the results of Comparative Examples 3 and 4 and Examples 3 to 7, the crystallinity and the TCR of the nickel thin-film were affected by not only the thin-film disposed immediately under the nickel thin-film but also the type of thin-film disposed under the thin-film, and in particular, in a case where the underlying layer had a configuration in which the chromium oxide and silicon oxide were stacked, the interplanar spacing of the Ni(111) plane tended to be reduced, and the TCR tended to be increased.

From these results, it can be seen that an electroconductive film having a small lattice spacing of the nickel crystals, a high TCR, and excellent applicability to a temperature sensor film can be obtained by forming the underlying layer on the resin film base, increasing the thickness of the nickel thin-film, and performing the heat treatment and the like after deposition of the nickel thin-film.

DESCRIPTION OF REFERENCE SIGNS 50 resin film base
5 resin film
6 hard coat layer
20 underlying layer
10 metal thin-film (nickel thin-film)
11 lead part
12 thermometric resistor part
122, 123 sensor wiring
19 connector
102 electroconductive film
110 temperature sensor film

The invention claimed is:

1. An electroconductive film for a temperature sensor, the electroconductive film comprising: a resin film base; and a nickel thin-film disposed on one principal surface of the resin film, wherein
an interplanar spacing of nickel (111) plane in the nickel thin-film is less than 0.2040 nm.

2. The electroconductive film according to claim 1, further comprising an inorganic underlying layer disposed between the resin film base and the nickel thin-film.

3. The electroconductive film according to claim 2, wherein the inorganic underlying layer includes at least one layer of silicon-based thin-film.

4. The electroconductive film according to claim 2, wherein the underlying layer includes a silicon oxide thin-film, and the nickel thin-film is in direct contact with the silicon oxide thin-film.

5. The electroconductive film according to claim 1, wherein a thickness of the nickel thin-film is 100 to 500 nm.

6. The electroconductive film for a temperature sensor according to claim 1, wherein a temperature coefficient of resistance of the nickel thin-film is 4,000 ppm/° C. or more.

7. A method for producing the electroconductive film set forth in claim 1, the method comprising depositing the nickel thin-film by a sputtering method.

8. A temperature sensor film comprising: a resin film base; and a patterned nickel thin-film disposed on one principal surface of the resin film base, wherein the nickel thin-film is patterned to form a thermometric resistor part patterned into a thin wire and used for measuring a temperature and a lead part connected to the thermometric resistor part and patterned to have a larger wiring width than that of the thermometric resistor part, and an interplanar spacing of nickel (111) plane in the nickel thin-film is less than 0.2040 nm.

* * * * *